United States Patent
Arai

(10) Patent No.: US 10,282,487 B2
(45) Date of Patent: May 7, 2019

(54) MASK DATA GENERATION METHOD

(71) Applicant: CANON KABUSHIKI KAISHA, Tokyo (JP)

(72) Inventor: Tadashi Arai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1694 days.

(21) Appl. No.: 13/906,142

(22) Filed: May 30, 2013

(65) Prior Publication Data

US 2013/0321789 A1 Dec. 5, 2013

(30) Foreign Application Priority Data

Jun. 5, 2012 (JP) ................................ 2012-128134

(51) Int. Cl.
  *G03F 7/20* (2006.01)
  *G03F 1/44* (2012.01)
  *G06F 17/50* (2006.01)

(52) U.S. Cl.
  CPC .............. *G06F 17/50* (2013.01); *G03F 1/44* (2013.01); *G03F 7/70058* (2013.01)

(58) Field of Classification Search
  CPC .......... G03F 7/70058; G03F 1/44; G03F 1/68; G03F 1/72
  See application file for complete search history.

(56) References Cited

U.S. PATENT DOCUMENTS

| 6,518,180 B1* | 2/2003 | Fukuda ..................... G03F 1/26 257/E21.577 |
| 2003/0022071 A1* | 1/2003 | Sugita ..................... G03F 7/203 430/5 |
| 2005/0081178 A1* | 4/2005 | Sivakumar .......... G03F 7/70466 430/22 |

(Continued)

FOREIGN PATENT DOCUMENTS

| JP | 2010-123943 A | 6/2010 |
| JP | 2012-027058 A | 2/2012 |

(Continued)

OTHER PUBLICATIONS

Michael C. Smayling, "Low k1 Logic Design using Gridded Design Rules", Proc. of SPIE, 2008, 7 pages, vol. 6925, SPIE, Bellingham, Washington.

*Primary Examiner* — Steven Whitesell Gordon
(74) *Attorney, Agent, or Firm* — Canon U.S.A., Inc. IP Division

(57) ABSTRACT

A mask data generation method includes obtaining data of a pattern including a plurality of pattern elements, dividing a region of the pattern into a plurality of sections so that each pattern element is arranged in each section by using the obtained data of the pattern and generating map data including information indicative of presence or absence of the pattern element in each section, setting one piece of mask individual information out of a plurality pieces of mask individual information for each section including the pattern (Continued)

element by using a constraint condition, which inhibits setting of same mask individual information in a constraint region including one section and surrounding sections thereof, and the map data, and generating the data of the plurality of masks corresponding to the plurality pieces of mask individual information by using the set mask individual information.

15 Claims, 10 Drawing Sheets

(56) References Cited

U.S. PATENT DOCUMENTS

| | | | |
|---|---|---|---|
| 2005/0112474 A1* | 5/2005 | Sandstrom | G03F 7/70425 430/5 |
| 2005/0196684 A1* | 9/2005 | Nakamura | G03F 1/92 430/5 |
| 2007/0031740 A1 | 2/2007 | Chen | |
| 2011/0003254 A1* | 1/2011 | Chang | G03F 7/70466 430/322 |
| 2011/0078638 A1 | 3/2011 | Kahng | |

FOREIGN PATENT DOCUMENTS

| | | |
|---|---|---|
| TW | 562993 B | 11/2003 |
| TW | 339775 B | 4/2011 |

* cited by examiner

- SQUARE VALUE "0"

- SQUARE VALUE "1"

- MASK NUMBER "1"

- MASK NUMBER "2"

- MASK NUMBER "3"

FIG. 6

MASK DATA GENERATION METHOD

BACKGROUND OF THE INVENTION

Field of the Invention

The present invention relates to a mask data generation method.

Description of the Related Art

Exposure apparatuses (lithography apparatuses) are used in the lithography process of the semiconductor device manufacturing process. The lithography process is a process for transferring a circuit pattern of a semiconductor device onto a substrate (also called a silicon substrate, a glass substrate, or a wafer). An illumination optical system of an exposure apparatus illuminates a mask (reticle) using a light beam emitted from a light source. Then, the circuit pattern formed on the mask is transferred onto a wafer via, for example, a projection optical system.

In recent years, due to pattern miniaturization of semiconductor devices, a method called multiple patterning is used. According to this multiple patterning, one layer of a wafer is exposed a plurality of times using a plurality of masks. Accordingly, patterns of a plurality of masks are formed on the wafer.

A resolution limit of an exposure apparatus is expressed by $hp = k1 \times \lambda / NA$. In this equation, "hp" is an abbreviation for half pitch, which is half the shortest distance between two adjacent patterns. Further, "k1" is a process-related factor, "$\lambda$" is an exposure wavelength, and "NA" is a numerical aperture of the exposure apparatus. According to the multiple patterning, a pattern, which has a smaller half pitch than a half pitch of a resolution limit of an exposure apparatus, is divided into patterns of a plurality of masks. When a wafer is exposed by using the obtained mask pattern, a pattern which is finer than the resolution limit can be formed on the wafer.

Since a method for dividing one layout (pattern) into patterns of a plurality masks is similar to coloring of maps, it is generally called a coloring problem. In the following description, the dividing method of a pattern may be described using an expression used for coloring. A method for dividing an original target pattern into patterns of a plurality masks is discussed in U.S. Patent Application Publication No. 2007/0031740 and U.S. Patent Application Publication No. 2011/0078638.

In U.S. Patent Application Publication No. 2007/0031740, there is described a method that repeatedly applies a division rule. According to this technique, a division rule is determined. Then, a target pattern is divided into patterns to be formed by a first mask or a second mask based on the division rule. This process is repeatedly performed for each pattern.

U.S. Patent Application Publication No. 2011/0078638 discusses a pattern division method that uses a conflict graph and mathematical programming. A conflict graph is composed of vertex and edge. When the conflict graph is applied to the pattern division, each mask pattern is indicated by a vertex, and the patterns that exceed the resolution limit are connected by an edge. Further, the pattern is divided in such a manner that mask numbers of two regions sharing a boundary (edge) are different. This process uses the integer programming.

On the other hand, according to the drive to lower k1 values, it has become difficult to transfer a desired pattern onto a wafer with fidelity using the conventional two-dimensional layout pattern that extends in X and Y directions. Thus, in recent years, a manufacturing method of circuit patterns called one-dimensional layout technique, such as the technique discussed in "Low k1 Logic Design using Gridded Design Rules", Michael C. Smayling, et al., Proc. of SPIE Vol. 6925 (2008), has been developed. According to the one-dimensional layout technique, a single pitch line and space (L/S) pattern is formed. Then, at a plurality of positions, a plurality of pattern elements of a hole pattern or a cut pattern having the same size are exposed on regular grids. Subsequently, the single pitch L/S pattern is cut at the pattern elements and a circuit pattern is manufactured. According to this method, not only the exposure area is reduced compared to the conventional two-dimensional pattern, but the exposure process can be performed more easily.

According to U.S. Patent Application Publication No. 2007/0031740 and U.S. Patent Application Publication No. 2011/0078638, the pattern division is performed based on a two-dimensional layout pattern that extends in X and Y directions. According to U.S. Patent Application Publication No. 2007/0031740, whether a target pattern and other patterns apply to the division rule needs to be determined for all of the two-dimensional layout patterns. Accordingly, long time is necessary in the calculation. Further, according to U.S. Patent Application Publication No. 2011/0078638, the distance between patterns needs to be calculated for all of the two-dimensional layout patterns in order to generate the conflict graph. Thus, a long calculation time is necessary.

Further, there have been no previous cases of the pattern division method discussed in U.S. Patent Application Publication No. 2007/0031740 and U.S. Patent Application Publication No. 2011/0078638 applied to a plurality of pattern elements of a hole pattern or a cut pattern of a one-dimensional layout. Even if the pattern division method is actually applied to the plurality of pattern elements, it is necessary to calculate the distance between all the pattern elements by using data of the plurality of pattern elements and to determine whether the obtained distance satisfies a constraint condition of the distance. Accordingly, a long calculation time is necessary.

SUMMARY OF THE INVENTION

The present invention is directed to a mask data generation method useful for generating mask data by dividing a pattern including a plurality of pattern elements in a shorter time.

According to an aspect of the present invention, a mask data generation method for generating, using a computer, data of a plurality of masks including a first mask and a second mask used for multiple patterning for exposing a substrate using the first mask and then exposing the substrate using the second mask includes obtaining data of a pattern including a plurality of pattern elements, dividing a region of the pattern into a plurality of sections so that each pattern element is arranged in each section by using the obtained data of the pattern and generating map data including information indicative of presence or absence of the pattern element in each section, setting one piece of mask individual information out of a plurality pieces of mask individual information for each section including the pattern element by using a constraint condition, which inhibits setting of same mask individual information in a constraint region including one section and surrounding sections thereof, and the map data, and generating the data of the plurality of masks corresponding to the plurality pieces of mask individual information by using the set mask individual information.

Further features of the present invention will become apparent from the following detailed description of exemplary embodiments with reference to the attached drawings.

BRIEF DESCRIPTION OF THE DRAWINGS

FIG. 6 illustrates an example of a pattern to be divided.

DESCRIPTION OF THE EMBODIMENTS

The present invention is useful for generating data of a pattern of a mask (original plate) used for micromechanics and manufacturing various devices including a semiconductor chip such as an integrated circuit (IC) and a large-scale integration (LSI) circuit, a display device such as a liquid crystal panel, a detecting element such as a magnetic head, and an image sensor such as a charge-coupled device (CCD) sensor.

Figure 1:
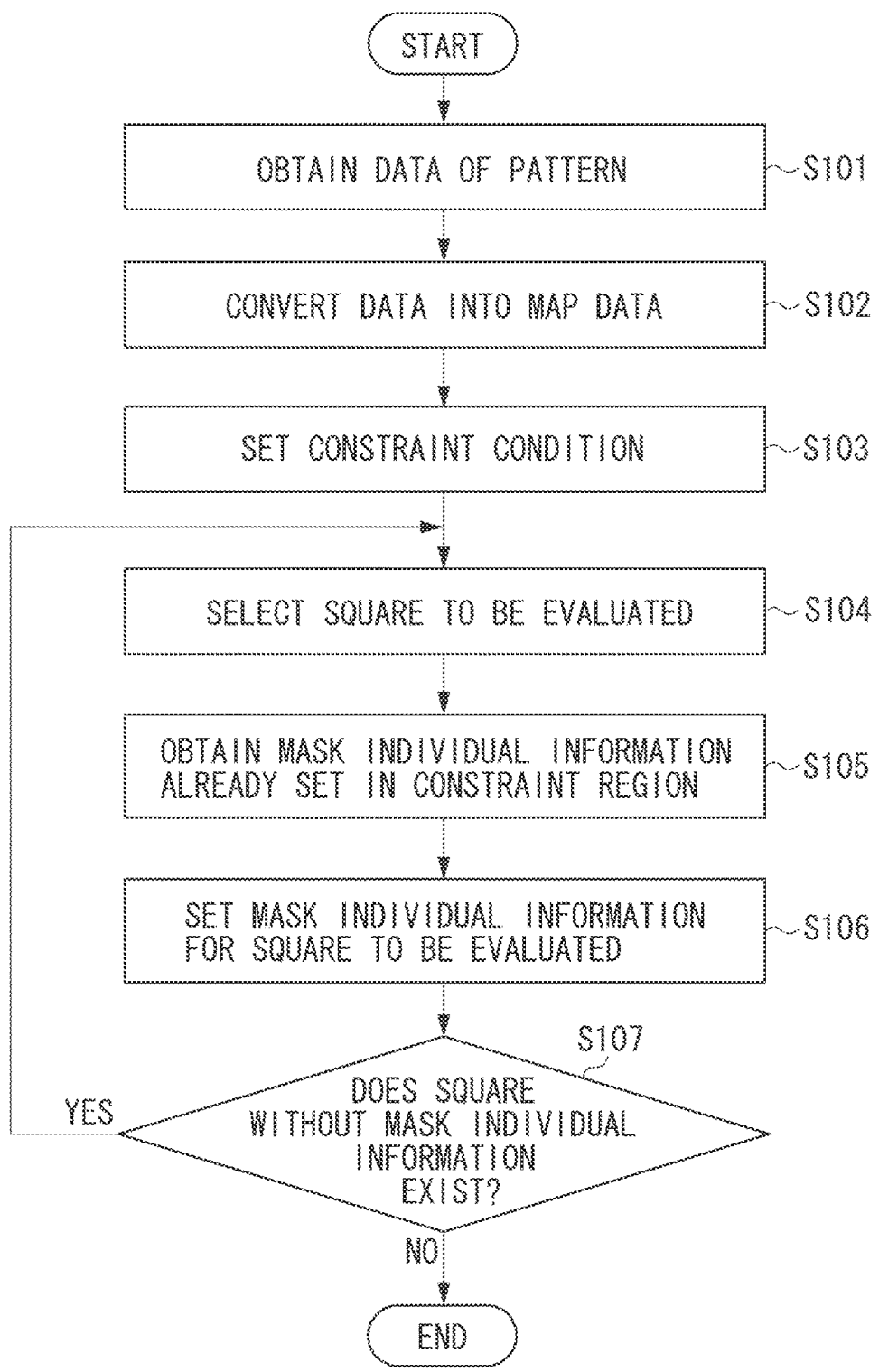
FIG. 1 is a flowchart illustrating a generation method of mask data according to a first exemplary embodiment of the present invention.

First, a mask data generation method according to the first exemplary embodiment will be described. FIG. 1 is a flowchart illustrating a generation method of mask data according to the first exemplary embodiment. The generation method is executed by an information processing apparatus such as a computer. According to the processing, data of a mask used for an exposure apparatus (lithography apparatus), which exposes a substrate so that an image of a mask pattern is transferred to the substrate, is generated.

Figure 2A:
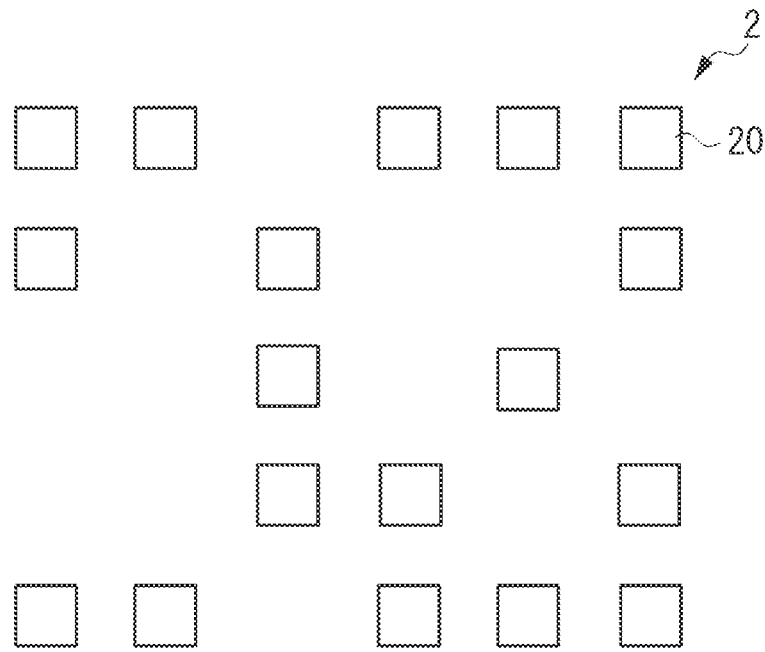
FIGS. 2A and 2B illustrate a pattern and map data, respectively.

In step S101, the computer acquires data of a pattern to be divided. FIG. 2A illustrates a hole pattern or a cut pattern used for the one-dimensional layout technique. In FIG. 2A, a pattern 2 includes a plurality of pattern elements 20 each of which has the same rectangular shape. According to the present embodiment, the pattern 2 is divided into patterns of a plurality of masks for, for example, a first mask, a second mask, and a third mask. Generally, data of a layout pattern, which is used for forming a pattern on a mask, is converted into polygon data in, for example, GDSII format and stored. The computer obtains the polygon data of the pattern 2.

Figure 2B:
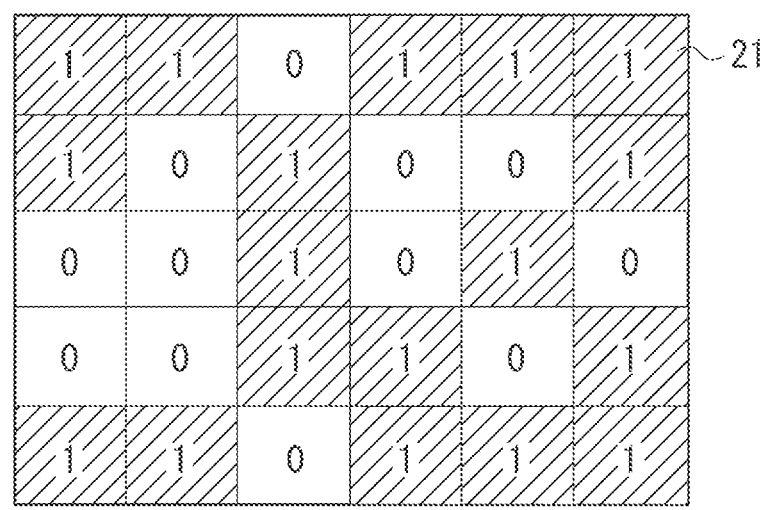

In step S102, the computer converts the data of the pattern 2 in the polygon data format into map data including a plurality of grids (or sections of any form) 21. An example of the map data is illustrated in FIG. 2B. The region of the pattern 2 is divided into a plurality of squares (or sections of any form) 21 having the same width so that each of the pattern elements 20 is arranged in one of the squares 21. Next, for each of the squares 21, "1" is assigned to a square including the pattern element 20 and "0" is assigned to a square not including the pattern element 20. Since each of the pattern elements 20 of the hole pattern or the cut pattern is designed to fit in a grid based on a grid design rule, each of the pattern elements 20 corresponds to each of the squares 21 with the same width by one-to-one correspondence. In this manner, the data of the pattern 2 is converted into map data including information indicative of the presence/absence of the pattern element 20 in each of the squares 21. The shape of each square is not limited to a rectangle and any shape can be used so long as each pattern element corresponds to each shape. Further, grid map data in which the arrangement of each of the pattern elements 20 is expressed by coordinates of each intersection of the grids by matching a position such as the center of each square with an intersection of a grid may be used as the map data.

Figure 3:
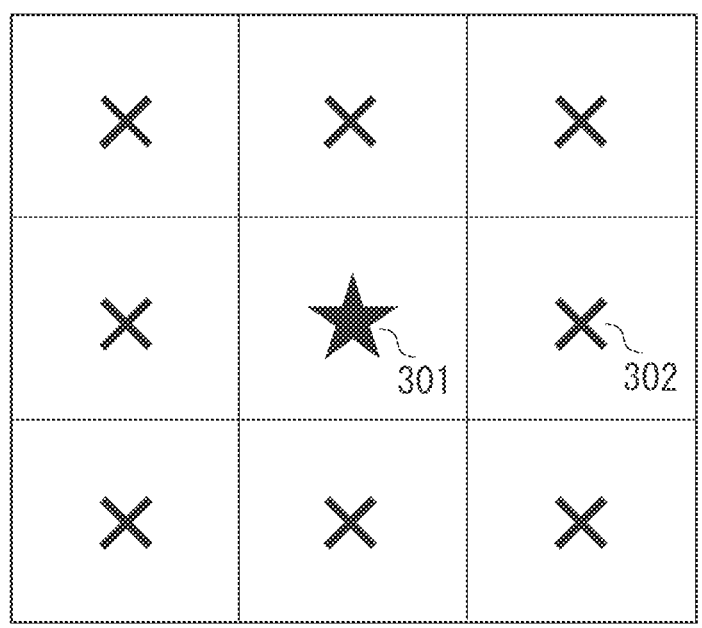
FIG. 3 illustrates a constraint region.

In step S103, the computer determines a constraint condition of the setting of the mask individual information. The determination method of the constraint condition will be described with reference to FIG. 3. First, a region including one square 301 and squares 302 surrounding the square 301 is set as a constraint region. In FIG. 3, the constraint region includes one square 301 (indicated by *) and squares 302 (indicated by X) above and below, right and left, and obliquely upward and downward with respect to the square 301. In this constraint region, since the squares are closely arranged, if the pattern elements of the squares are formed on one mask and exposure is performed using the mask, the resolution of the pattern elements may be reduced. Thus, a constraint condition is applied to this constraint region. According to this constraint condition, the use of the same mask individual information is inhibited in each square in the constraint region.

The mask individual information is, for example, number data or color data of the mask. The mask number is an individual number of each individual corresponding to each mask such as 1, 2, or 3. The squares in the constraint region are not limited to the squares above and below, right and left, and obliquely upward and downward with respect to the target square and can include a square at an arbitrary position where the resolution performance is reduced. For example, a square at a position three squares away from the square being the evaluation target can be included in the constraint region.

Figure 4A:
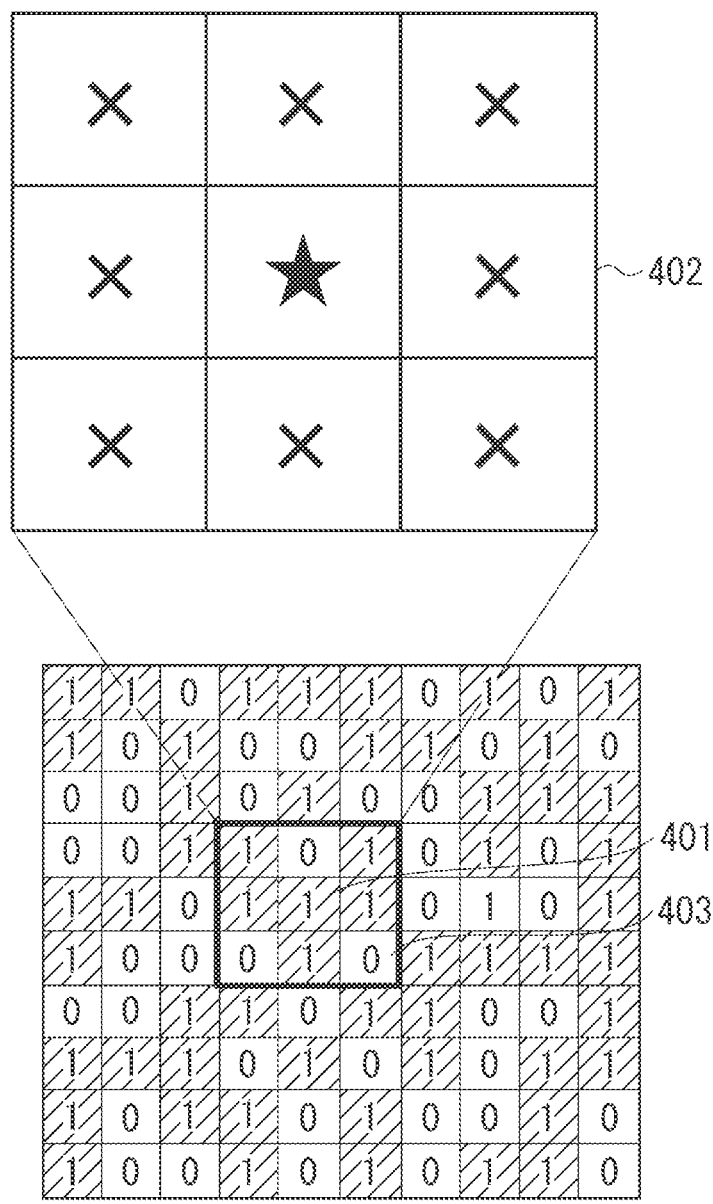
FIGS. 4A, 4B, and 4C illustrate a setting example of a mask number

In step S104, the computer selects one square as the evaluation target from the plurality of squares. In selecting the square, the computer selects a square including one of the pattern elements 21, which is a square with the value "1". For example, the computer selects a square 401 illustrated in FIG. 4A. In step S105, the computer obtains mask individual information which is already set in a constraint region 402 having the square 401 at the center. In step S106, the computer sets, for the square 401 as the evaluation target, mask individual information different from the mask individual information already set in the constraint region 402.

Figure 4B:
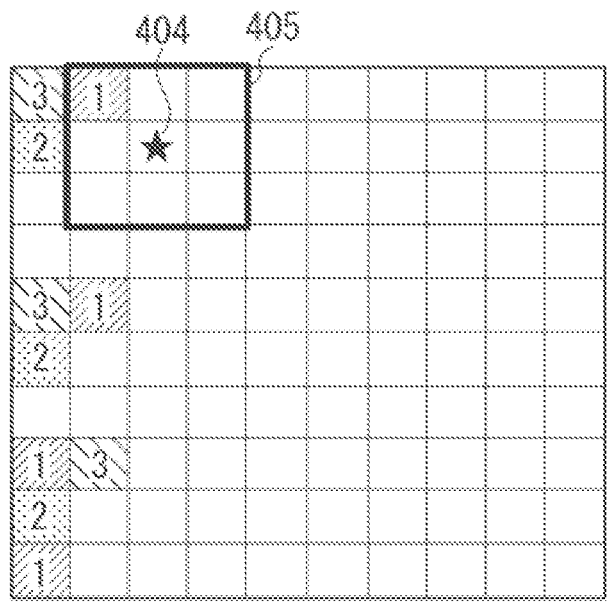

A case where some of the mask individual information (mask number) is already determined will be described with reference to FIG. 4B. If a square 404 is a square of the evaluation target, a constraint region 405 will be the constraint region. Since mask number "1" is already used in the constraint region 405, mask number "2" will be set for the square 404.

In step S107, the computer determines whether a square without the mask individual information exists in the plurality of squares including the pattern element 21. If a square without the mask individual information exists (YES in step S107), the processing returns to step S104, and a square as a different evaluation target to which the mask individual information is to be set will be selected. Then, steps S105 to S107 are repeated. Although, a square with the pattern element 21, which is a square with the value "1", is selected in step S104, and a region having the selected square set at the center is selected as the constraint region, the selection of the square is not limited to such an example. For example, regardless of whether a pattern element exists or not, all the squares may be sequentially selected, and the constraint region can be set by setting the selected square at the center. If a square without the mask individual information does not exist (NO in step S107), then the processing ends.

Figure 4C:
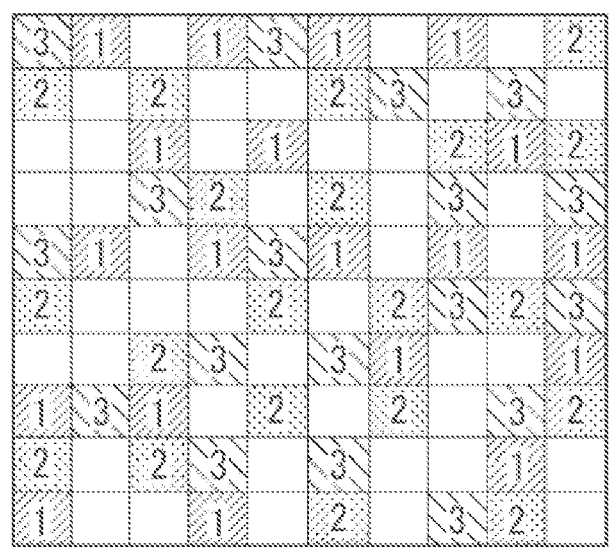
Figure 4D:
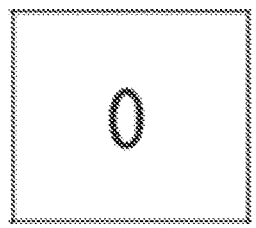
FIG. 4D illustrates a table identifying squares in FIG. 4A and masks in FIGS. 4B-4C.
Figure 4D:
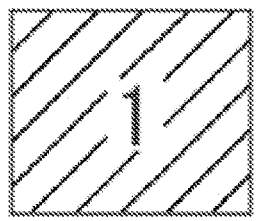
Figure 4D:
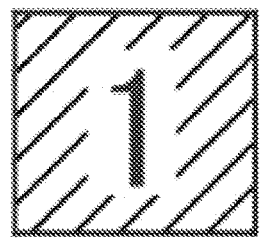
Figure 4D:
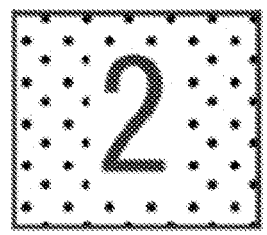
Figure 4D:
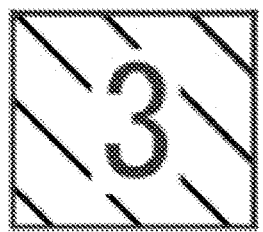

In this manner, the mask individual information is set for all of the squares including the pattern element 21, and the data is output. FIG. 4C illustrates map data having the mask individual information set for all of the squares that include the pattern element 21. In FIG. 4C, the mask number of the mask individual information is set for each square.

The data of the mask pattern is generated according to the mask individual information and the pattern 2 is divided into patterns of a plurality of masks according to the generated data. More precisely, as illustrated in FIG. 4C, the pattern 2 is divided into patterns of a first mask including pattern elements corresponding to mask number "1", a second mask including pattern elements corresponding to mask number "2", and a third mask including pattern elements corresponding to mask number "3".

There are a number of methods for setting the mask individual information in step S106. For example, there is a method that assigns the smallest number of the unused mask numbers in the constraint region. According to the example in FIG. 4B, for example, in determining the mask number of the square 404 being the evaluation target, since the mask number "1" is already used in the constraint region 405, "2" which is the smallest mask number of the unused mask numbers is set for the square 404. Further, there is a method that randomly selects one number which is equal to or smaller than a largest mask number from unused mask numbers in the constraint region after determining the largest mask number (at least 2). For example, according to the example in FIG. 4B, in determining the mask number of the square 404 as the evaluation target, since the mask number "1" is already used in the constraint region 405, if the maximum predetermined mask number is "3", "2" or "3" is randomly determined as the mask number for the square 404. This method is expressed as a random digit method.

Figure 5:
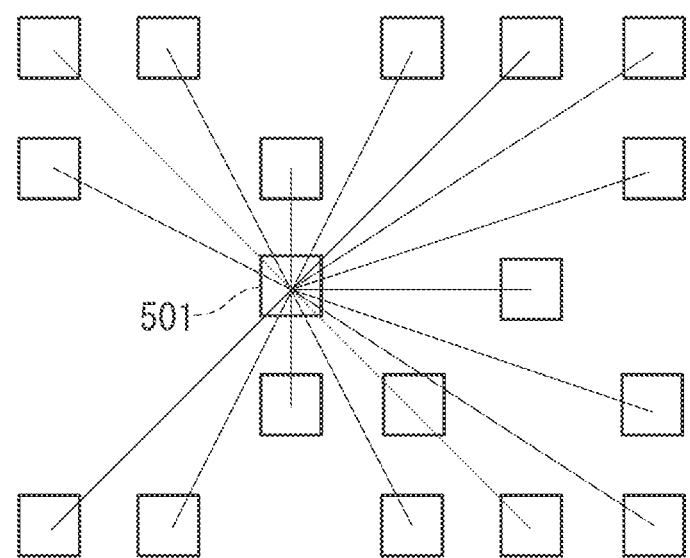
FIG. 5 illustrates a conventional example of polygon data subjected to pattern division without being converted into map data.

A case where the polygon data is divided into patterns without converting the polygon data into map data as is conventionally performed will be described with reference to FIG. 5. First, as illustrated in FIG. 5, in order to determine the mask number of a pattern element 501 being the evaluation target, a distance between the center of the pattern element 501 and the center of each of all the surrounding pattern elements is calculated. Then, a pattern element that does not satisfy the constraint condition of the distance between the pattern elements is determined. Further, whether mask individual information is already set for the pattern element that does not satisfy the constraint condition is determined. If mask individual information is already set, mask individual information different from the mask individual information which has been set will be set for the pattern element 501. The more the number of pattern elements around the pattern element 501 being the evaluation target, the longer it takes to calculate the distance.

On the other hand, according to the present embodiment, since the polygon data is converted into map data where each pattern element is associated with each square and a constraint region of a limited area is set based on the map data, unnecessary calculation of the distance of all the pattern elements can be avoided, and the calculation time can be reduced.

Figure 6:
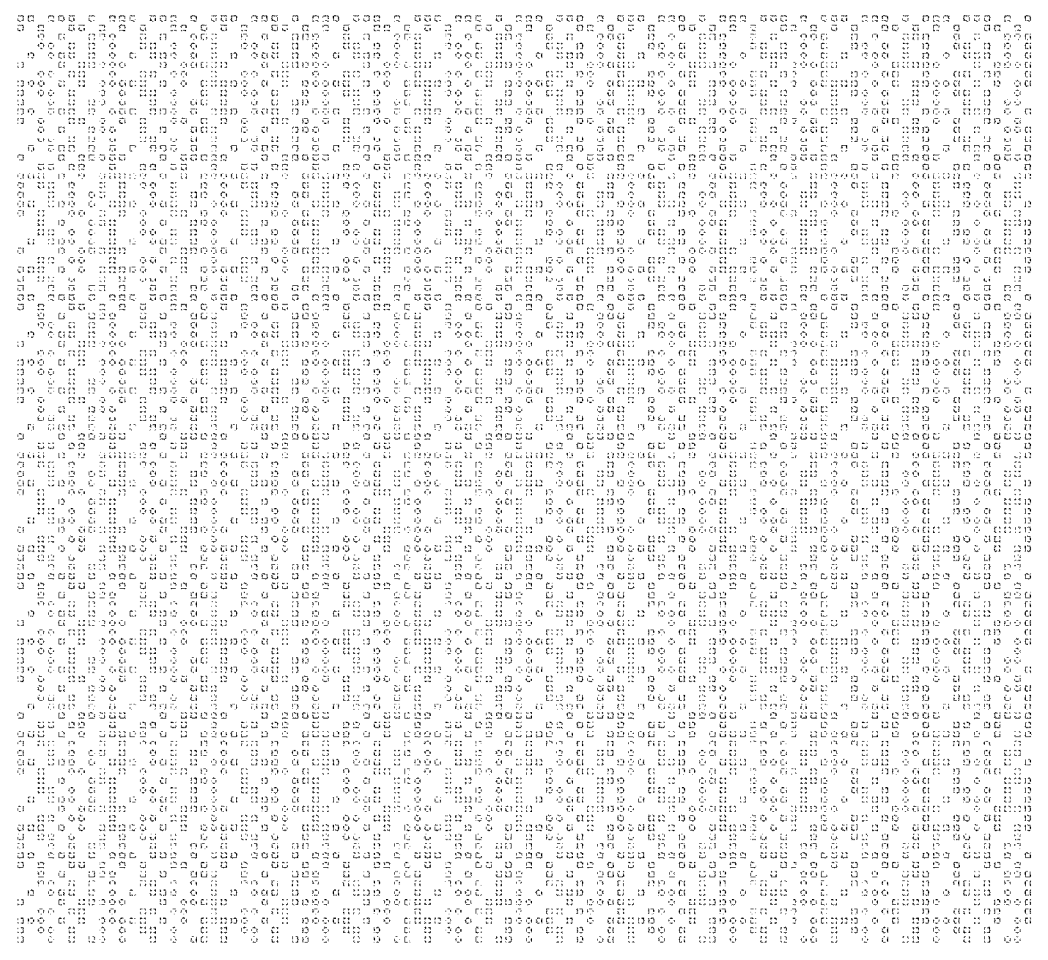

FIG. 6 illustrates 5600 rectangular pattern elements. When different mask individual information was set for each square that does not satisfy the constraint condition of the distance by using the conventional method, without converting the polygon data into map data and calculating the distance between center positions of pattern elements, the calculation time was 4.99 seconds. On the other hand, when the polygon data was converted into map data and the mask number was set according to the random digit method as is performed in the present embodiment, the calculation time was 0.51 second. Thus, the calculation time was reduced to approximately 10%.

Figure 7:
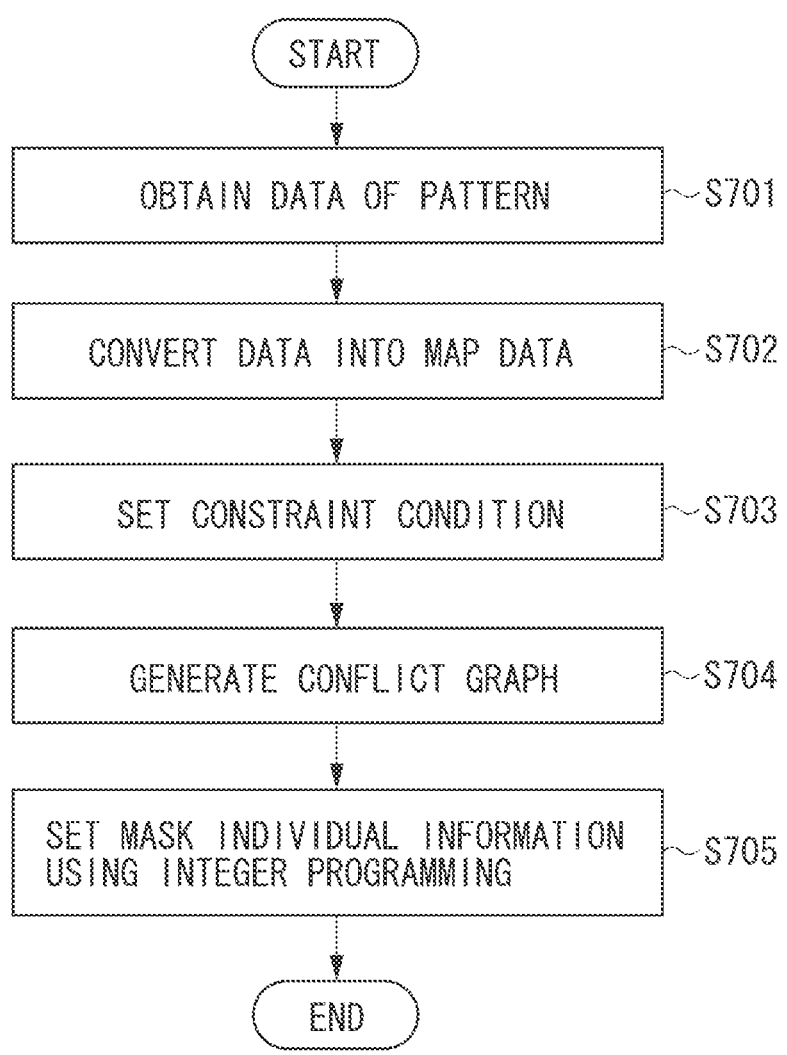
FIG. 7 is a flowchart illustrating a generation method of mask data according to a second exemplary embodiment of the present invention.

Next, a second exemplary embodiment of the present invention will be described. FIG. 7 is a flowchart illustrating the generation method of the mask data according to the second exemplary embodiment.

In step S701, the computer acquires data of a pattern to be divided. In step S702, the computer converts the data of the pattern in the polygon data format into map data divided into a plurality of squares. In step S703, the computer determines the constraint condition. Steps S701 to 703 are similar to steps S101 to S103 according to the first exemplary embodiment.

Figure 8:
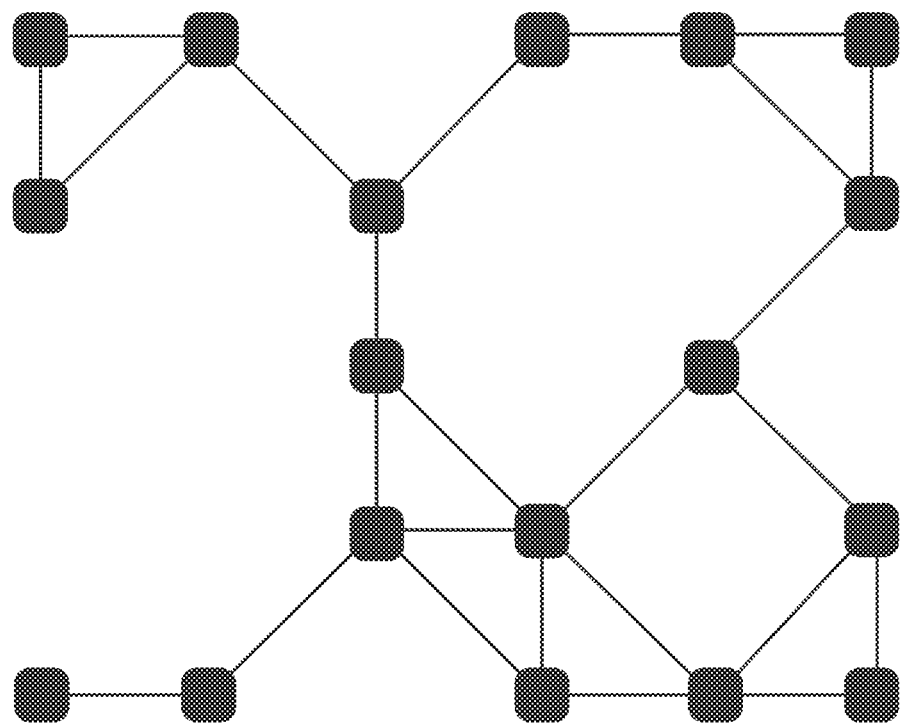
FIG. 8 illustrates an example of a conflict graph.

In step S704, the computer generates a conflict graph based on the map data. According to the conflict graph, the pattern elements are expressed using vertexes and vertexes that exceed the resolution limit are connected by an edge. First, one square including a pattern element is selected. Then, in the constraint region that includes the selected square, the selected square and a square including a pattern element are connected with an edge. This is performed for all the squares that include a pattern element. Mask individual information at one end of an edge of this graph needs to be different from mask individual information at the other end. In this manner, the constraint condition regarding the setting of the mask individual information is set. FIG. 8 illustrates a conflict graph of the map data illustrated in FIG. 2B. It is obtained by using the constraint region illustrated in FIG. 3.

In step S705, the computer sets the mask individual information by using integer programming. An example of the integer programming which aims at minimizing the number of masks is expressed in the mathematical expression below.

(1) Description of Variables j: mask number $1 \leq j \leq m$ m: maximum mask number $y_j$: binary variable indicating whether mask number j is to be used. 0: use, 1: not use i: pattern element number $x_{ij}$: binary variable indicating whether mask number j is to be used for pattern element number i. 0: use, 1: not use (2) Description of Mathematical Expression The cost function (objective function) is expressed as follows:

$$\text{minimize} \sum_{j=1}^{m} y_j$$

This means that the number of mask numbers to be used is to be minimized.

$$\sum_{j=1}^{m} y_j \quad (7)$$

Since the mathematical expression (7) is equal to the number of mask numbers, if the number of mask numbers is increased from "2" to "3", the value of the mathematical expression (7) will be changed from "2" to "3". The number of mask numbers is the number of masks which are formed by dividing the pattern. Thus, from the viewpoint of the mask cost, it is important to divide the pattern into a smaller number of masks.

The constraint condition is expressed by the following expressions:

$$y_1 \geq y_2 \geq \ldots \geq y_m \quad (8)$$

$$\sum_{j=1}^{m} x_{ij} = 1 \; (\forall\, i) \quad (9)$$

$$x_{ij} \leq y_j \; (\forall\, i, \forall\, j) \quad (10)$$

$$x_{ij} + x_{i'j} \leq 1 \; (\forall\, j) \quad (11)$$

The boundary condition is expressed by the equation below:

$$y_1 = 1 \quad (12)$$

The mathematical expression (8) indicates a constraint condition that the mask number needs to be assigned in the ascending order. It is a constraint condition that prevents the use of the second mask number ($y_2=1$) if the first mask number is not used ($y_1=0$).

The mathematical expression (9) indicates that only one mask number is to be set for $x_i$ being the i-th pattern element. It is a constraint condition that prevents both the first mask number and the second mask number from being set for the i-th pattern element.

The mathematical expression (10) indicates that the mask number will not be set using a mask number which is not used. In other words, it is a constraint condition that prevents the use of the j-th mask number ($x_{ij}=1$) for the i-th pattern element when the j-th mask number is not used ($y_i=0$).

The mathematical expression (11) indicates a constraint condition of a pattern based on the conflict graph. The constraint condition is used when the i-th pattern and the i'-th pattern are connected by a line segment. In other words, it is used when the same mask number should not be assigned. Thus, this constraint condition is not applied to all pattern elements. This constraint condition is set for the pattern elements in one constraint region.

As for the boundary condition, the first mask number will be used as the mathematical expression (12) indicates.

In step S705, the computer inputs the above-described mathematical expressions in the execution software of the integer programming, performs calculation, and sets the mask individual information. Then, the computer outputs data of squares with the mask individual information added.

According to the present exemplary embodiment, a pattern is divided in a shorter time when data of patterns of a plurality of masks is generated.

The above-described exemplary embodiments can also be achieved by supplying a software program that implements each function of aforementioned exemplary embodiments to a system or an apparatus via a network or various types of storage media, and a computer (or a CPU or an MPU) in the system or the apparatus reads and executes the program stored in such storage media.

The data of the mask generated as described above is input in a mask drawing apparatus and a plurality of masks are manufactured. The manufactured mask is mounted on a mask stage of the exposure apparatus and illuminated by an illumination optical system. According to this illumination, an image of the mask pattern is exposed on the wafer. After the exposure of a wafer using one of the manufactured masks is finished, the same layer of the wafer is exposed using a different mask. In this manner, a pattern can be formed on one layer of the wafer by multiple patterning.

Next, a manufacturing method for a device, such as a liquid crystal display device, will be described. The manufacturing process for a liquid crystal display device includes a forming process of transparent electrodes. The transparent electrode forming process includes applying a photosensitive material to a glass substrate having transparent conductive coatings by vapor deposition, setting the mask manufactured as described above on an exposure apparatus and exposes the glass substrate with the application of the photosensitive material, and developing the glass substrate.

In the above-described exposure apparatus, an illumination optical system illuminates a mask with light from a light source to transfer a circuit pattern formed on the mask onto a wafer via a projection optical system or the like. However, the exemplary embodiment is not limited to such an exposure apparatus. The exposure apparatus may be an imprint apparatus configured to form a pattern on a substrate by bring a pattern formed on a mold and a resin applied on the substrate into contact with each other and then curing or hardening the resin. In this case, data of the divided mask pattern corresponds to a pattern formed on the mold. In addition, the exposure apparatus described in the exemplary embodiment may be an apparatus configured to perform drawing on a substrate with charge particle beams (electron beams). In this case, the apparatus configured to perform drawing is controlled based on data of the divided mask pattern. Furthermore, images of patterns may be formed by using the above-described various apparatuses in combination for each divided mask pattern.

In addition to the manufacture of the liquid crystal display device, the above-described device manufacturing method using the exposure apparatus is also appropriate for use with a device such as a semiconductor device. The method can include mounting of the mask manufactured as described above on an exposure apparatus, exposing the photosensitive material applied substrate, and developing the illuminated substrate. Further, the device manufacturing method can include other known processes such as oxidation, film formation, vapor deposition, doping, planarization, etching, resist stripping, dicing, bonding, and packaging.

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment (s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-128134 filed Jun. 5, 2012, and Japanese Patent Application No. 2013-104297 filed May 16, 2013 each of which is hereby incorporated by reference herein in its entirety.

What is claimed is:

1. A mask data generation method for generating, using a computer, data of a plurality of masks used for a mask manufacturing method to manufacture a mask, wherein the plurality of masks includes a first mask and a second mask used for multiple patterning, for patterning a substrate using the first mask and then patterning the substrate using the second mask, the mask data generation method comprising:
    obtaining data of pattern including a plurality of pattern elements, wherein the plurality of pattern elements is arranged apart from each other;
    generating, according to the obtained data of pattern, a plurality of sections so that one pattern element of the plurality of pattern elements is to be arranged in one section of the plurality of sections and generating map data including indicative information indicative of presence or absence of the pattern element in each section of the plurality of sections according to the obtained data of pattern;
    setting a constraint condition which causes mask individual information set for one section in a constraint region to be different from mask individual information set for sections surrounding the one section in the constraint region such that sections in the constraint region sharing a common boundary do not have the same mask individual information, wherein each section of the plurality of sections can have any one piece of a plurality of pieces of mask individual information;
    setting, by using the constraint condition and the map data, one piece of mask individual information out of the plurality of pieces of mask individual information for each section having the pattern element such that the number of the masks is smallest; and
    generating the data of the plurality of masks corresponding to the plurality of pieces of mask individual information by using the set mask individual information,
    wherein the mask manufacturing method comprises manufacturing the plurality of masks based on the generated data of the plurality of masks.

2. The mask data generation method according to claim 1, wherein the constraint region is a region including the one section in the constraint region and the sections surrounding the one section in the constraint region.

3. The mask data generation method according to claim 1, wherein the constraint region is a region including one section in the constraint region and sections adjacent to the one section in the constraint region.

4. The mask data generation method according to claim 1, further comprising:
    setting a plurality of pieces of mask individual information by repeating, for the plurality of sections, selecting a target section from the plurality of sections; and
    setting, for the target section, mask individual information that is different from the mask individual information set for the one section in the constraint region that also includes the selected target section.

5. The mask data generation method according to claim 1, wherein setting mask individual information includes setting mask individual information which has been randomly selected from a group of mask individual information not already being used in the constraint region out of the plurality of pieces of mask individual information.

6. The mask data generation method according to claim 1, further comprising setting the mask individual information using integer programming.

7. The mask data generation method according to claim 6, further comprising setting the mask individual information such that, in a case where a number of pieces of the mask individual information is used as a cost function in the integer programming, the cost function is minimized.

8. The mask data generation method according to claim 6, further comprising, if the section having the pattern element out of the plurality of sections is set as a vertex, setting the constraint condition by connecting vertexes by an edge in the constraint region where setting of same mask individual information is inhibited, and setting the mask individual information by using the integer programming such that the same mask individual information is not set in a section of the vertexes connected by the edge.

9. The mask data generation method according to claim 1, wherein the mask individual information is number data or color data.

10. The mask data generation method according to claim 1, wherein the pattern is a hole pattern or a cut pattern to be used for a one-dimensional layout technique.

11. The mask data generation method according to claim 1, further comprising inputting the generated data of the plurality of masks into a mask drawing apparatus to manufacture the plurality of masks.

12. A non-transitory computer-readable storage medium storing a program to cause a computer to perform a mask data generation method for generating, using a computer, data of a plurality of masks used for a mask manufacturing method to manufacture a mask, wherein the plurality of masks includes a first mask and a second mask used for multiple patterning, for patterning a substrate using the first mask and then patterning the substrate using the second mask, the mask data generation method comprising:
    obtaining data of pattern including a plurality of pattern elements, wherein the plurality of pattern elements is arranged apart from each other;
    generating, according to the obtained data of pattern, a plurality of sections so that one pattern element of the plurality of pattern elements is to be arranged in one section of the plurality of sections and generating map data including indicative information indicative of presence or absence of the pattern element in each section of the plurality of sections according to the obtained data of pattern;
    setting a constraint condition which causes mask individual information set for one section in a constraint region to be different from mask individual information set for sections surrounding the one section in the constraint region such that sections in the constraint region sharing a common boundary do not have the same mask individual information, wherein each section of the plurality of sections can have any one piece of a plurality of pieces of mask individual information;
setting, by using the constraint condition and the map data, one piece of mask individual information out of the plurality of pieces of mask individual information for each section having the pattern element such that the number of the masks is smallest; and
generating the data of the plurality of masks corresponding to the plurality of pieces of mask individual information by using the set mask individual information,
wherein the mask manufacturing method comprises manufacturing the plurality of masks based on the generated data of the plurality of masks.

13. An information processing apparatus for executing a mask data generation method for generating, using a computer, data of a plurality of masks used for a mask manufacturing method to manufacture a mask, wherein the plurality of masks includes a first mask and a second mask used for multiple patterning, for patterning a substrate using the first mask and then patterning the substrate using the second mask, the mask data generation method comprising:
obtaining data of pattern including a plurality of pattern elements, wherein the plurality of pattern elements is arranged apart from each other;
generating, according to the obtained data of pattern, a plurality of sections so that one pattern element of the plurality of pattern elements is to be arranged in one section of the plurality of sections and generating map data including indicative information indicative of presence or absence of the pattern element in each section of the plurality of sections according to the obtained data of pattern;
setting a constraint condition which causes mask individual information set for one section in a constraint region to be different from mask individual information set for sections surrounding the one section in the constraint region such that sections in the constraint region sharing a common boundary do not have the same mask individual information, wherein each section of the plurality of sections can have any one piece of a plurality of pieces of mask individual information;
setting, by using the constraint condition and the map data, one piece of mask individual information out of the plurality of pieces of mask individual information for each section having the pattern element such that the number of the masks is smallest; and
generating the data of the plurality of masks corresponding to the plurality of pieces of mask individual information by using the set mask individual information,
wherein the mask manufacturing method comprises manufacturing the plurality of masks based on the generated data of the plurality of masks.

14. A lithography apparatus for patterning, in multiple patterning, a substrate using a pattern formed on a first mask and then using a pattern formed on a second mask, wherein data of a plurality of masks including the first mask and the second mask is generated by using a computer to perform a mask data generation method for generating, using a computer, data of a plurality of masks used for a mask manufacturing method to manufacture a mask, wherein the plurality of masks includes a first mask and a second mask used for multiple patterning, for patterning a substrate using the first mask and then patterning the substrate using the second mask, the mask data generation method comprising:
obtaining data of pattern including a plurality of pattern elements, wherein the plurality of pattern elements is arranged apart from each other;
generating, according to the obtained data of pattern, a plurality of sections so that one pattern element of the plurality of pattern elements is to be arranged in one section of the plurality of sections and generating map data including indicative information indicative of presence or absence of the pattern element in each section of the plurality of sections according to the obtained data of pattern;
setting a constraint condition which causes mask individual information set for one section in a constraint region to be different from mask individual information set for sections surrounding the one section in the constraint region such that sections in the constraint region sharing a common boundary do not have the same mask individual information, wherein each section of the plurality of sections can have any one piece of a plurality of pieces of mask individual information;
setting, by using the constraint condition and the map data, one piece of mask individual information out of the plurality of pieces of mask individual information for each section having the pattern element such that the number of the masks is smallest; and
generating the data of the plurality of masks corresponding to the plurality of pieces of mask individual information by using the set mask individual information,
wherein the mask manufacturing method comprises manufacturing the plurality of masks based on the generated data of the plurality of masks.

15. A device manufacturing method including patterning a substrate using a lithography apparatus and developing the patterned substrate, wherein the lithography apparatus is for patterning, in multiple patterning, a substrate using a pattern formed on a first mask and then using a pattern formed on a second mask, and wherein data of a plurality of masks including the first mask and the second mask is generated by using a computer to perform a mask data generation method for generating, using a computer, data of a plurality of masks used for a mask manufacturing method to manufacture a mask, wherein the plurality of masks includes a first mask and a second mask used for multiple patterning, for patterning a substrate using the first mask and then patterning the substrate using the second mask, the mask data generation method comprising:
obtaining data of pattern including a plurality of pattern elements, wherein the plurality of pattern elements is arranged apart from each other;
generating, according to the obtained data of pattern, a plurality of sections so that one pattern element of the plurality of pattern elements is to be arranged in one section of the plurality of sections and generating map data including indicative information indicative of presence or absence of the pattern element in each section of the plurality of sections according to the obtained data of pattern;
setting a constraint condition which causes mask individual information set for one section in a constraint region to be different from mask individual information set for sections surrounding the one section in the constraint region such that sections in the constraint region sharing a common boundary do not have the same mask individual information, wherein each section of the plurality of sections can have any one piece of a plurality of pieces of mask individual information;

setting, by using the constraint condition and the map data, one piece of mask individual information out of the plurality of pieces of mask individual information for each section having the pattern element such that the number of the masks is smallest; and generating the data of the plurality of masks corresponding to the plurality of pieces of mask individual information by using the set mask individual information, wherein the mask manufacturing method comprises manufacturing the plurality of masks based on the generated data of the plurality of masks.

\* \* \* \* \*

UNITED STATES PATENT AND TRADEMARK OFFICE
CERTIFICATE OF CORRECTION

PATENT NO. : 10,282,487 B2  
APPLICATION NO. : 13/906142  
DATED : May 7, 2019  
INVENTOR(S) : Tadashi Arai Page 1 of 1

It is certified that error appears in the above-identified patent and that said Letters Patent is hereby corrected as shown below:

On the Title Page

After Item --(30) Foreign Application Priority Data  
Jun. 5, 2012 (JP) .................................. 2012-128134--

Please insert the following:  
--May 16, 2013 (JP) ................................ 2013-104297--

Signed and Sealed this  
Seventeenth Day of September, 2019

Andrei Iancu  
*Director of the United States Patent and Trademark Office*